United States Patent [19]

Mazuré et al.

[11] Patent Number: 5,677,219
[45] Date of Patent: Oct. 14, 1997

[54] PROCESS FOR FABRICATING A DRAM TRENCH CAPACITOR

[75] Inventors: Carlos A. Mazuré, Kirchseeon, Peru; Christian G. Dieseldorff, Poughkeepsie, N.Y.

[73] Assignee: Siemens Aktiengesellschaft, Munich, Germany

[21] Appl. No.: 365,649

[22] Filed: Dec. 29, 1994

[51] Int. Cl.⁶ .............................. H01L 21/70; H01L 27/00
[52] U.S. Cl. ...................... 437/52; 437/919; 437/203
[58] Field of Search ...................... 437/919, 52, 60, 437/203

[56] References Cited

U.S. PATENT DOCUMENTS

| | | |
|---|---|---|
| 4,728,623 | 3/1988 | Lu et al. ............................. 437/52 |
| 4,728,625 | 3/1988 | Lu ..................................... 257/301 |
| 5,316,962 | 5/1994 | Matsuo et al. ..................... 437/52 |

FOREIGN PATENT DOCUMENTS 63-107061  5/1988  Japan ........................ 437/52

*Primary Examiner*—Jey Tsai
*Attorney, Agent, or Firm*—Adel A. Ahmed; Dexter K. Chin

[57] ABSTRACT

An improved trench cell capacitor for a memory cell and process for fabricating the same. The process includes the steps of forming a trench within a semiconductor body; forming a dielectric layer peripherally within the trench and filling at least a portion of the trench by epitaxially growing semiconductor material therein. The epitaxially grown semiconductor material is void and seam-free, resulting in a robust trench cell that is highly reliable, thereby improving process yield.

14 Claims, 8 Drawing Sheets

PROCESS FOR FABRICATING A DRAM TRENCH CAPACITOR

FIELD OF THE INVENTION

The present invention relates generally to integrated circuit memory cells and more particularly to a process for fabricating a DRAM trench capacitor employing selective epitaxial growth within the capacitor trench.

BACKGROUND OF THE INVENTION

Trench cell capacitors for modern dynamic random access memories (DRAMS) using buried plate technology are widely known. A DRAM memory cell consists of a transistor and a trench cell capacitor. In a buried plate cell, a heavily doped buried layer of a doped semiconductor material is disposed within the substrate, at a predetermined depth level from the top surface of the DRAM. This buried layer forms the first plate of the capacitor. A trench cell extending from the top surface of the DRAM penetrates the buried layer. This trench cell is filled with doped polysilicon, which serves as the second plate of the capacitor. A thin dielectric layer surrounds the doped polysilicon within the trench, thus separating the two capacitor plates. The transistor is formed within the top portion of the substrate in proximity to the trench capacitor. A gate electrode interconnects the polysilicon within the capacitor trench to a terminal of the transistor to transfer logic level voltages to and from the transistor and the capacitor.

One type of prior art trench cell capacitor employs a thin oxide layer as the dielectric surrounding the polysilicon in the lower portion of the trench, adjacent to the highly doped buried layer. A thick oxide collar surrounds the polysilicon in the upper portion of the trench. The upper portion of the trench may be adjacent to selectively doped well regions of the active transistor supplying the logic to the trench capacitor. These well regions are often structured with respect to each other and to the buried layer such that an undesirable vertical parasitic transistor is formed adjacent to the upper portion of the trench cell. In this situation, the thick oxide collar serves to prevent turn on of the parasitic transistor by substantially isolating the doped polysilicon within the trench, which would otherwise serve as a gate electrode for that parasitic transistor.

An example of a trench cell capacitor employing such a thick oxide collar can be had by reference to U.S. Pat. No. 4,794,434 entitled "Trench Cell for a DRAM", which issued on Dec. 27, 1988 to P. Pelly, III. Fabrication of this type of trench cell begins by forming a generally cylindrical trench from the top surface of the DRAM to a depth which penetrates the buried layer. A thin oxide layer is then formed along the sidewalls and the bottom of the trench. A first highly doped polysilicon "plug" is formed in the lower portion of the trench by low pressure chemical vapor phase deposition (LPCVD). The thick oxide collar is then formed peripherally around the sidewalls of the upper portion of the trench, above the first polysilicon plug. Then, a second LPCVD doped polysilicon plug is formed the region surrounded by the thick oxide collar in the remaining upper trench portion. In subsequent process steps, gate electrodes are formed between the top of the second plug and one of the well regions of the active transistor, to provide the path by which the logic level voltages are transferred. Other oxide and nitride insulating layers are then formed above the trench capacitor is further process steps.

The above-described process of trench cell capacitor formation presents several problems. The second polysilicon plug is prone to having voids or seams due to imperfections in the LPCVD process. These voids or seams may appear on the top surface of the second polysilicon fill plug, or may extend down to a substantial depth within the trench. In the presence of these voids or seams, the subsequent oxidations in the process further disturb the planarization of the topography at the top surface of the second polysilicon plug. This in turn leads to formation of conductive residues or stringers during the gate electrode patterning. The residues or stringers are a major cause of yield loss in the process.

It is therefore an object of the present invention to provide an improved process for fabricating a trench cell capacitor, which process eliminates the aforementioned problems of the prior art.

SUMMARY OF THE INVENTION

The present invention is directed towards an improved trench cell capacitor for a memory cell, and a process for fabricating the same. The improved trench cell capacitor is of the type having a trench penetrating a doped buried layer within a semiconductor body, where the doped buried layer forms a first plate of the capacitor. The trench has a lower portion filled with doped semiconductor material to substantially form a second plate of the capacitor, and a peripheral dielectric layer separating the two capacitor plates. The improved process includes the step of filling the trench by epitaxially growing semiconductor material in a top portion thereof. The epitaxially grown material is void and seam-free, resulting in a robust trench cell that is highly reliable and which avoids the problems of chemically vapor deposited trench polysilicon of the prior art.

In a preferred embodiment of the process according to the present invention, a doped buried layer is first formed within a silicon substrate to form one plate of the capacitor. A deep trench is then formed within the silicon substrate to a depth level penetrating the buried layer. Next, a thin dielectric layer is deposited along the sidewalls and the bottom of the trench. A first polysilicon fill plug is then deposited using LPCVD in the lower portion of the trench, and doped to substantially constitute the second plate of the capacitor, with the dielectric layer separating the two capacitor plates. A thick oxide collar is then formed in the upper portion of the trench. Optionally, the oxide collar may have a thin silicon nitride layer formed on the inner sidewalls. A second polysilicon fill plug is then formed on the first fill plug in the region surrounded by the oxide collar, via selective epitaxial growth. A dopant gas such as arsenic may be used during the epitaxial growth process to dope the second plug to approximately the same doping level as the first plug. Alternatively, the epitaxial growth may be performed in the absence of a doping gas, whereupon the second polysilicon fill plug is doped in a subsequent step via ion implantation. In this case, the first and second polysilicon plugs may be doped together in one ion implantation step.

BRIEF DESCRIPTION OF THE DRAWINGS

For a full understanding of the present invention, reference is made to the following description of an exemplary embodiment thereof, considered in conjunction with the accompanying drawings, in which.

DESCRIPTION OF THE PREFERRED EMBODIMENT

Figure 1:
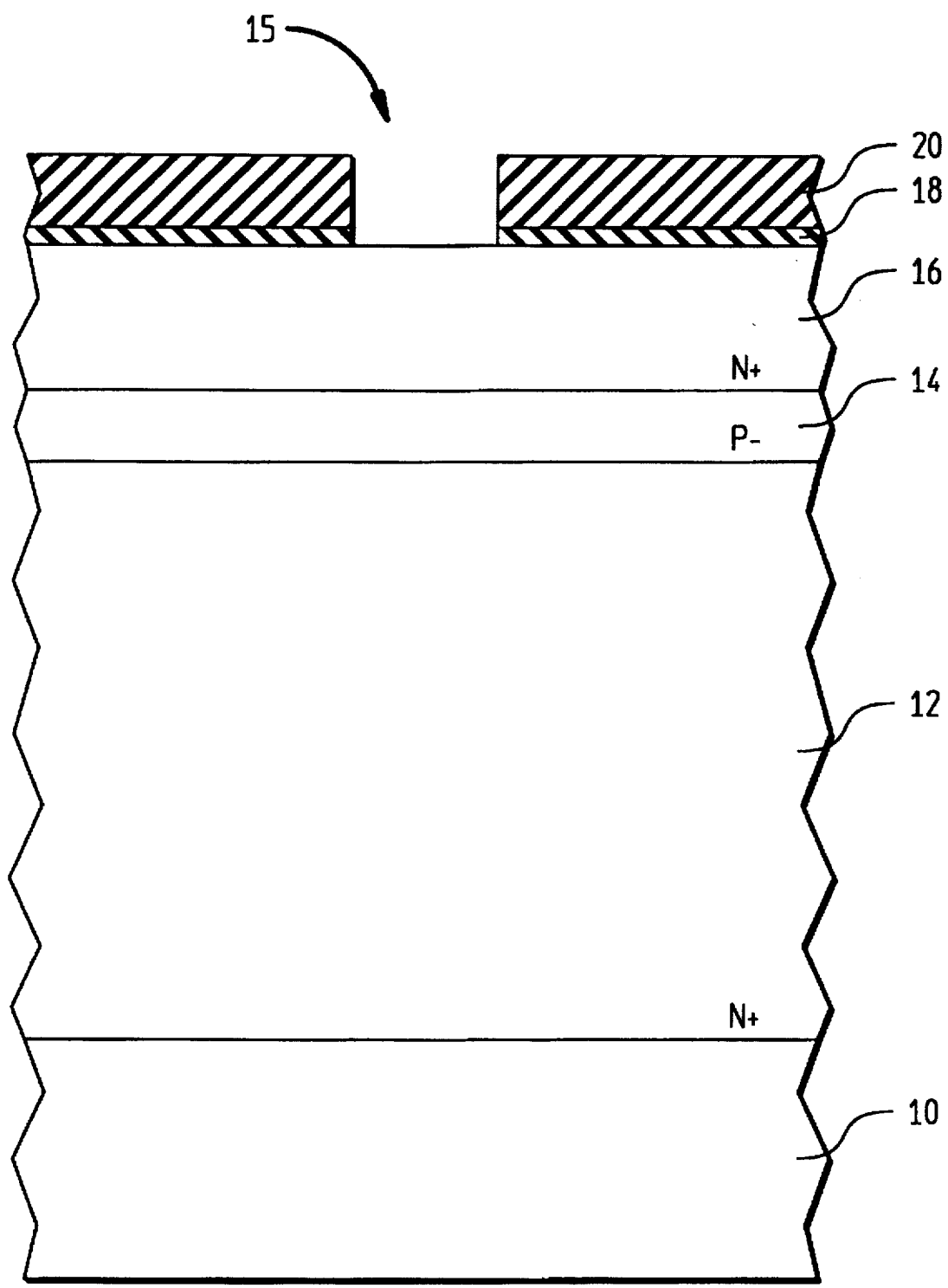
FIG. 1 shows an initial process step in forming the improved trench cell capacitor within a semiconductor substrate according to the present invention.

The preferred embodiment of a process for fabricating an improved trench cell capacitor according to the present invention is now described. The trench cell capacitor to be described forms a part of a DRAM memory cell. Referring to FIG. 1, a buried layer 12 is formed within a silicon substrate 10 and doped to a N+ impurity concentration. Buried layer 12 may be formed via selective ion implantation, epitaxial growth or a combination of both, as is commonly known in the art. This buried layer 12 will constitute one of the plates of the trench cell capacitor. Atop the buried layer 12, silicon layers 14 and 16 are epitaxially grown and doped P– and N+, respectively. It should be understood that opposite conductivities to those illustrated may be employed, as is known by those skilled in the art. Layers 14 and 16 form the channel and drain regions, respectively of an FET (not shown) which transfers logic level voltages to the trench capacitor to be formed. An oxide layer 18 and silicon nitride layer 20 are then sequentially deposited on the top surface of the structure, which layers are patterned via a conventional etching method to form an opening 15 that exposes the top surface of the drain region 16. The oxide layer 18 may be either tetra-ethyl-orthosilicate (TEOS), or silicon dioxide formed by thermal oxidation. Silicon nitride layer 20 may be $Si_3N_4$ deposited using LPCVD or plasma enhanced chemical vapor deposition (PECVD). Exemplary thicknesses for the layers are 50–100 nm for the oxide layer 18, and about 300 nm for the silicon nitride layer 20. Layers 18 and 20 serve as a hard mask for the formation of a trench within the opening 15. The silicon nitride layer 20 acts as an oxidation barrier to protect the top surface of the device during trench sidewall oxidation (to be described below).

Figure 2A:
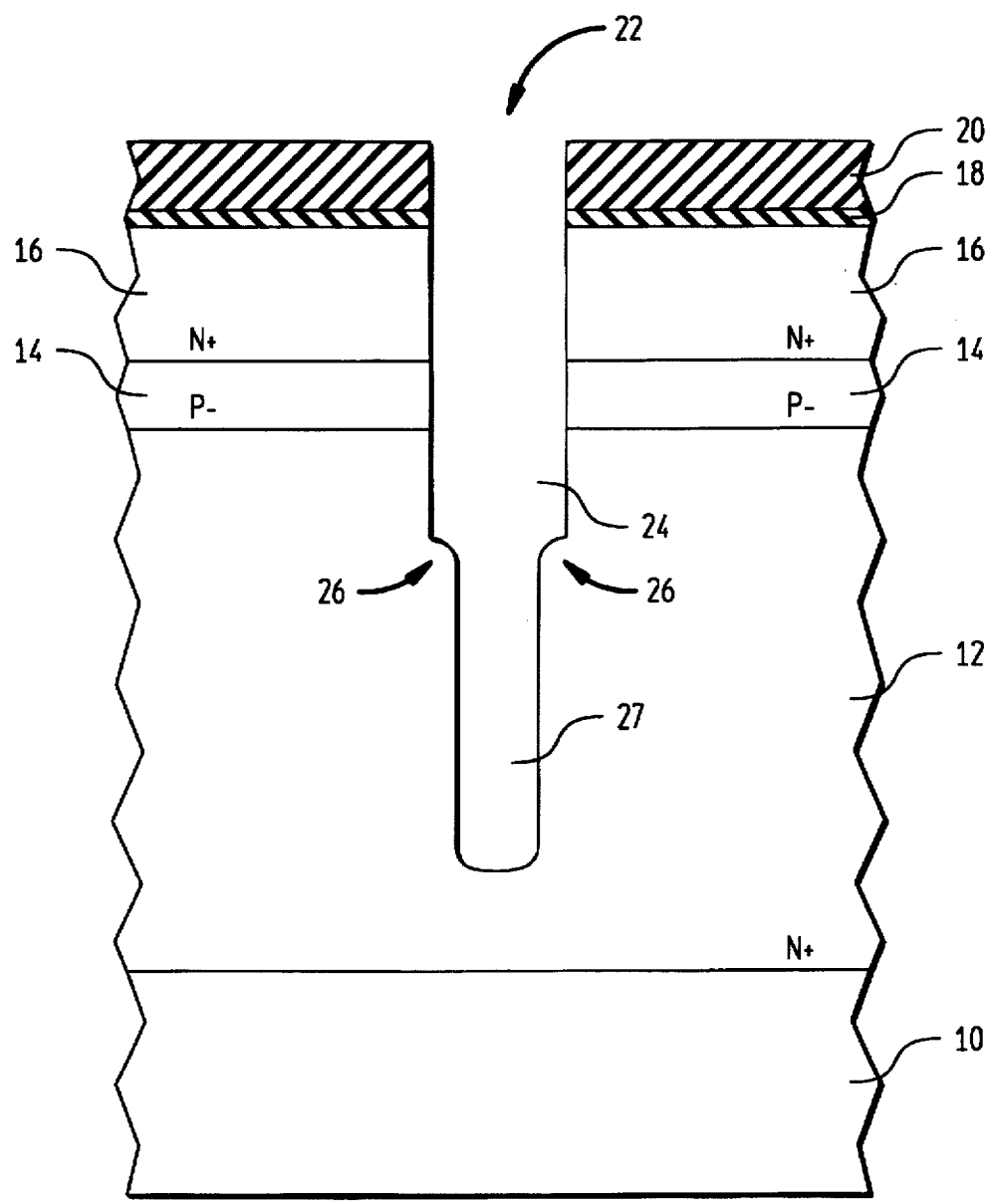
FIGS. 2A and 2B show cross-sectional and plan views, respectively, of a trench formed within the semiconductor substrate of FIG. 1.
Figure 2B:
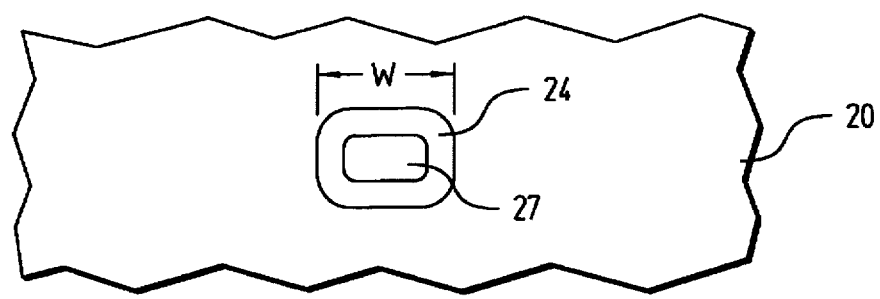

Next, the exposed silicon in the opening 15 is reactively ion etched in an atmosphere containing $SF_6$, $Cl_2$ and He to form a deep trench 22 as shown in FIGS. 2A and 2B. Other suitable atmospheres may alternatively be employed in the etching process. Trench 22 is thus formed by etching through the epitaxial layers 16 and 14 and through a substantial portion of the buried layer 12. The trench 22 has an exemplary depth of five microns, and an exemplary width W of 250–500 nm. Peripheral shoulders 26 define a lower portion 27 and upper portion 24 of the trench 22, where lower portion 27 has a smaller width than that of the upper portion 24. As shown in the plan view of FIG. 2B, the trench 22 may have a rectangular platform; however, the trench platform geometry may be tailored as desired for a particular application. Preferably, the trench 22 is formed with substantially vertical sidewalls.

Figure 3:
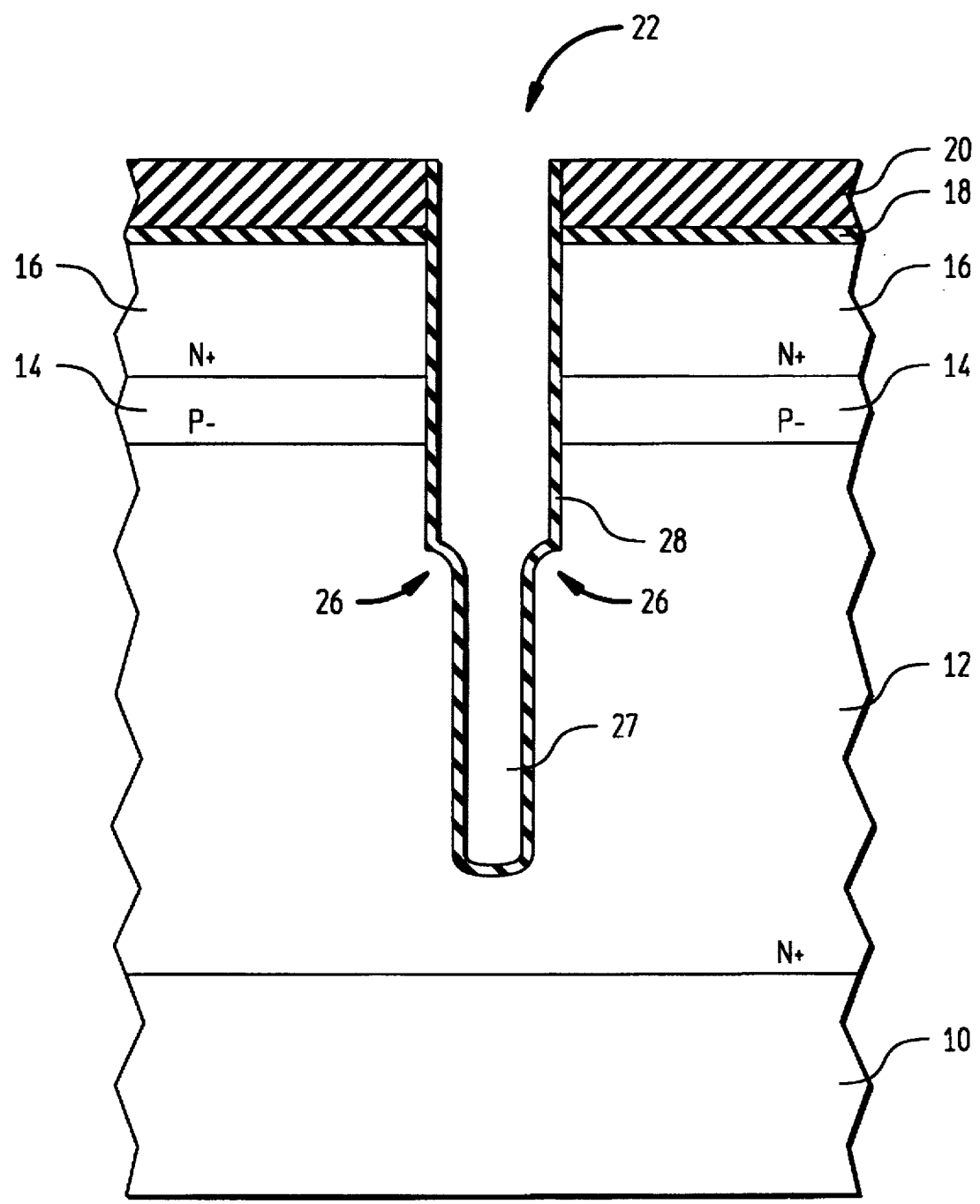
FIG. 3 depicts a cross-sectional view of a thin dielectric layer peripherally formed within the trench of FIGS. 2.

Referring now to FIG. 3, a thin dielectric layer 28 is then formed along the sidewalls and bottom of the trench 22. Dielectric layer 28 preferably has a thickness in the range of 10–50 nm, and is composed of silicon dioxide formed by thermal oxidation. Alternatively, dielectric layer 28 may be composed of a three layer oxide/nitride/oxide sandwich. In any case, the layer 28 serves as the dielectric separating the two plates of the trench capacitor. The thinner that layer 28 is made, the higher the capacitance, as is commonly known. The thickness of layer 28 at the bottom of the trench may be greater than along the sidewalls in order to reduce the possibility of punch-through at the bottom of the trench.

Figure 4:
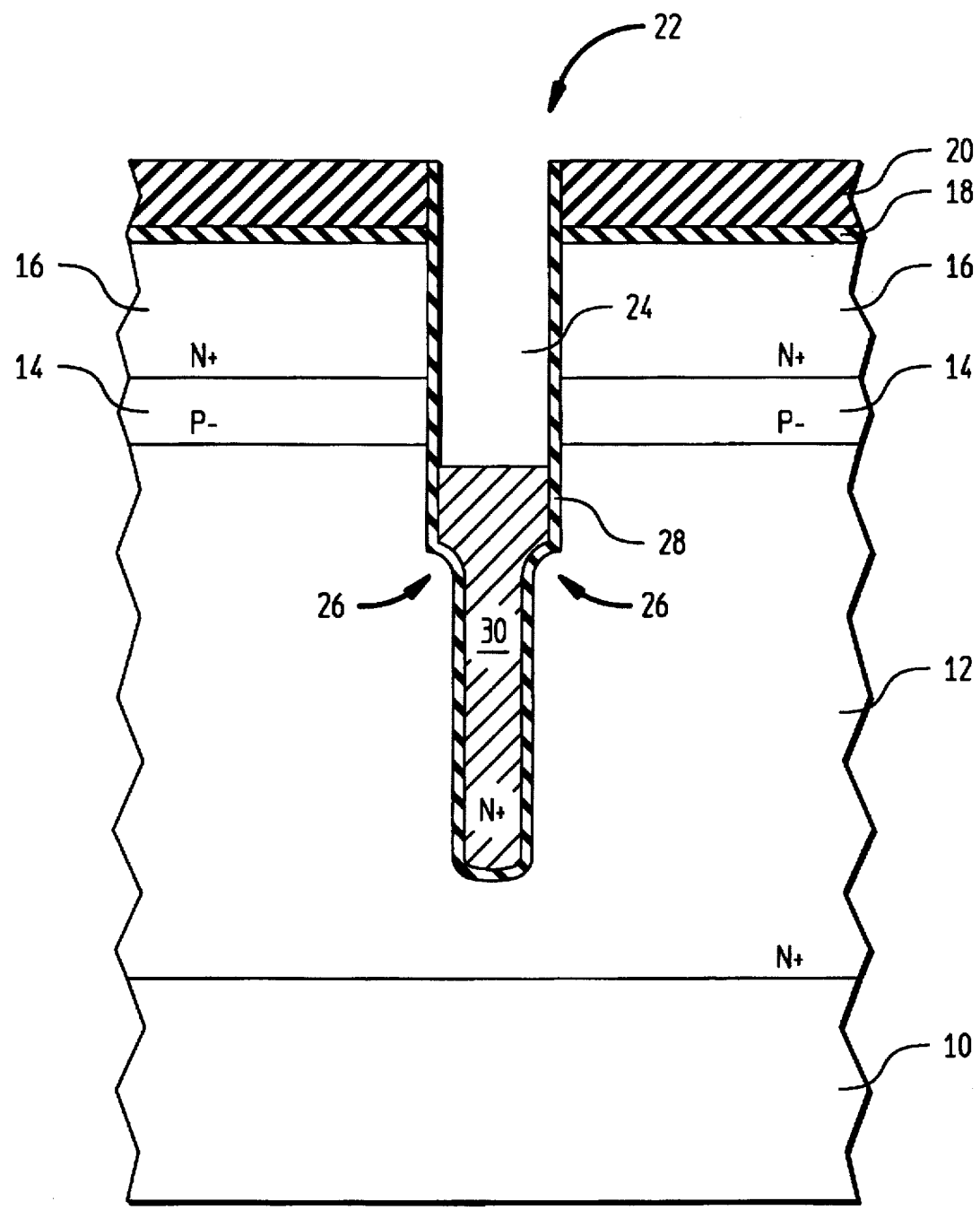
FIG. 4 illustrates a first polysilicon fill plug deposited within the trench of FIG. 3.

Turning now to FIG. 4, a first polysilicon "fill" plug 30 is formed by directional LPCVD to completely fill the lower portion 27 and a part of the upper portion 24 of the trench 22. Directional LPCVD is used with an ion beam impinging the device structure at normal incidence. This allows the trench to be filled with polysilicon essentially from the bottom up, without polysilicon being deposited on the upper sidewalls of the trench. A low temperature of less than about 750° C. is used in this process. An example of a suitable apparatus for such directional LPCVD is found in U.S. Pat. No. 5,290,358 entitled "Apparatus for Directional Low Pressure Chemical Vapor Depositor (DLPCVD)".

The fill plug 30 is highly doped with arsenic to provide a N+ impurity concentration in the illustrative embodiment. The doping of the fill plug 30 can be accomplished either during the LPCVD, or in a subsequent step via ion implantation. Polysilicon fill 30 thus forms the second plate of the trench capacitor—the first plate consists of the buried layer 12 in the immediate vicinity of the lower portion of the trench 22. In the case where the buried layer 12 is doped to a P+ impurity concentration, the fill plug 30 will of course also be doped P+ using a suitable doping agent such as boron. Fill 30 extends up from the bottom of the trench, above the trench shoulders 26, to a depth level of approximately one to two microns below the top surface of the silicon layer 16—thus, it has a vertical length of about three to four microns.

Figure 5A:
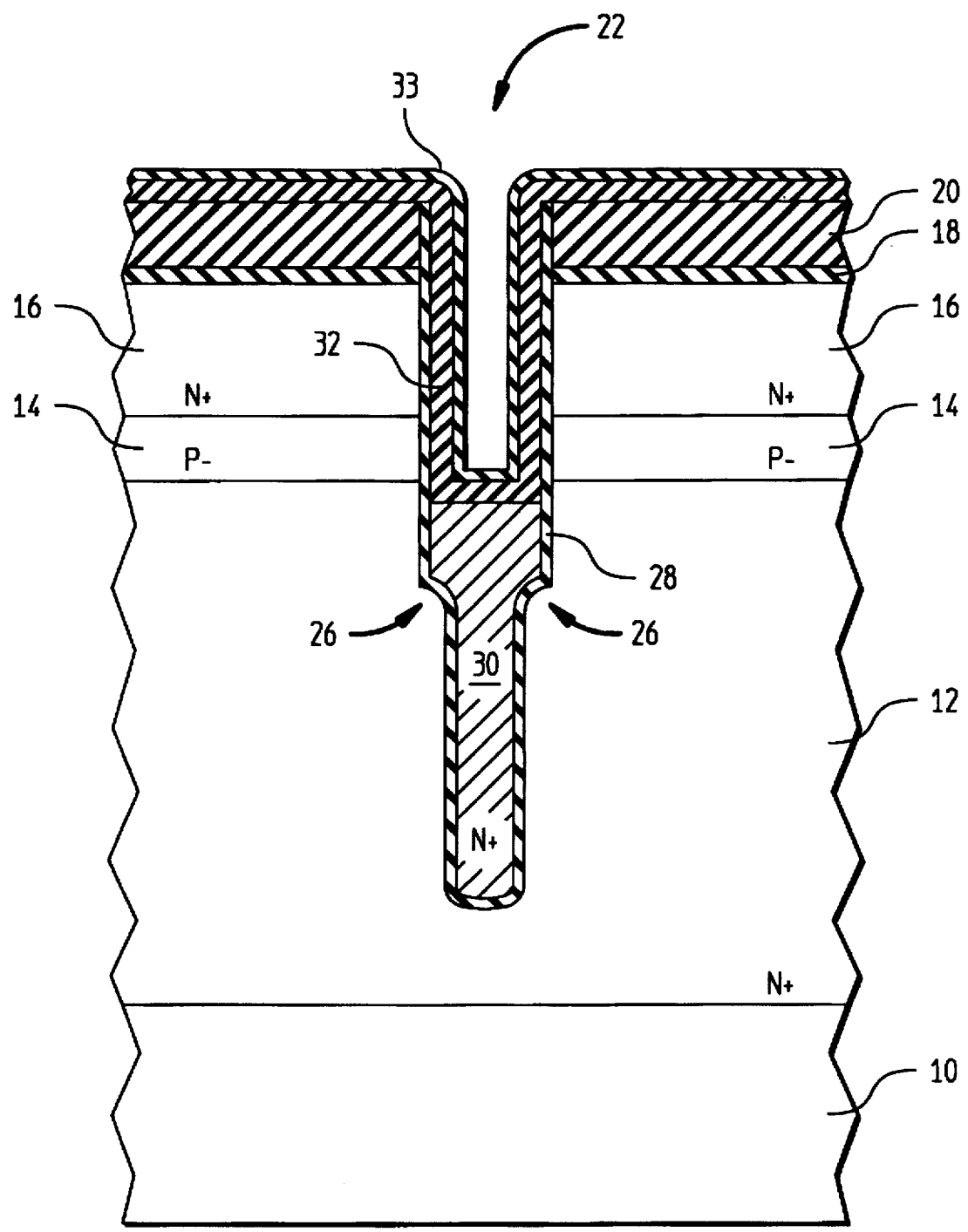
FIGS. 5A and 5B illustrate formation of an isolation collar within the trench of FIG. 4.

Following the deposition of the first polysilicon fill plug 30, a thick oxide layer 32 composed of TEOS or silicon dioxide, is formed peripherally around the remaining sidewalls of the trench 22, and on the top surface of the fill plug 30, as shown in FIG. 5A. The oxide layer 32 extends over the top of the trench 22 to overlay the nitride layer 20. An exemplary thickness for this layer 32 is in the range of 50–100 nm. On the oxide layer 32, a 5–20 nm thick silicon nitride layer 33 such as $Si_3N_4$ is deposited using, for example, LPCVD, CVD or PECVD. Thus, the total thickness of an isolation "collar" consisting of dielectric layer 28 together with oxide layer 32 and nitride layer 33, is in the range of about 65–170 nm (assuming a thickness range of 10–50 nm for dielectric layer 28). The addition of the nitride layer 33 affords several advantages. These include preventing excessive oxidation of the doped polysilicon within the trench during subsequent high temperature processing; and preventing outdiffusion of dopants through weak collar regions into regions of the vertical parasitic device adjacent to the trench cell capacitor, which would otherwise be turned on or exhibit leakage. Despite the aforementioned advantages, it should be understood that the additional nitride layer 33 may be eliminated if so desired, to reduce the complexity of the overall process.

Figure 5B:
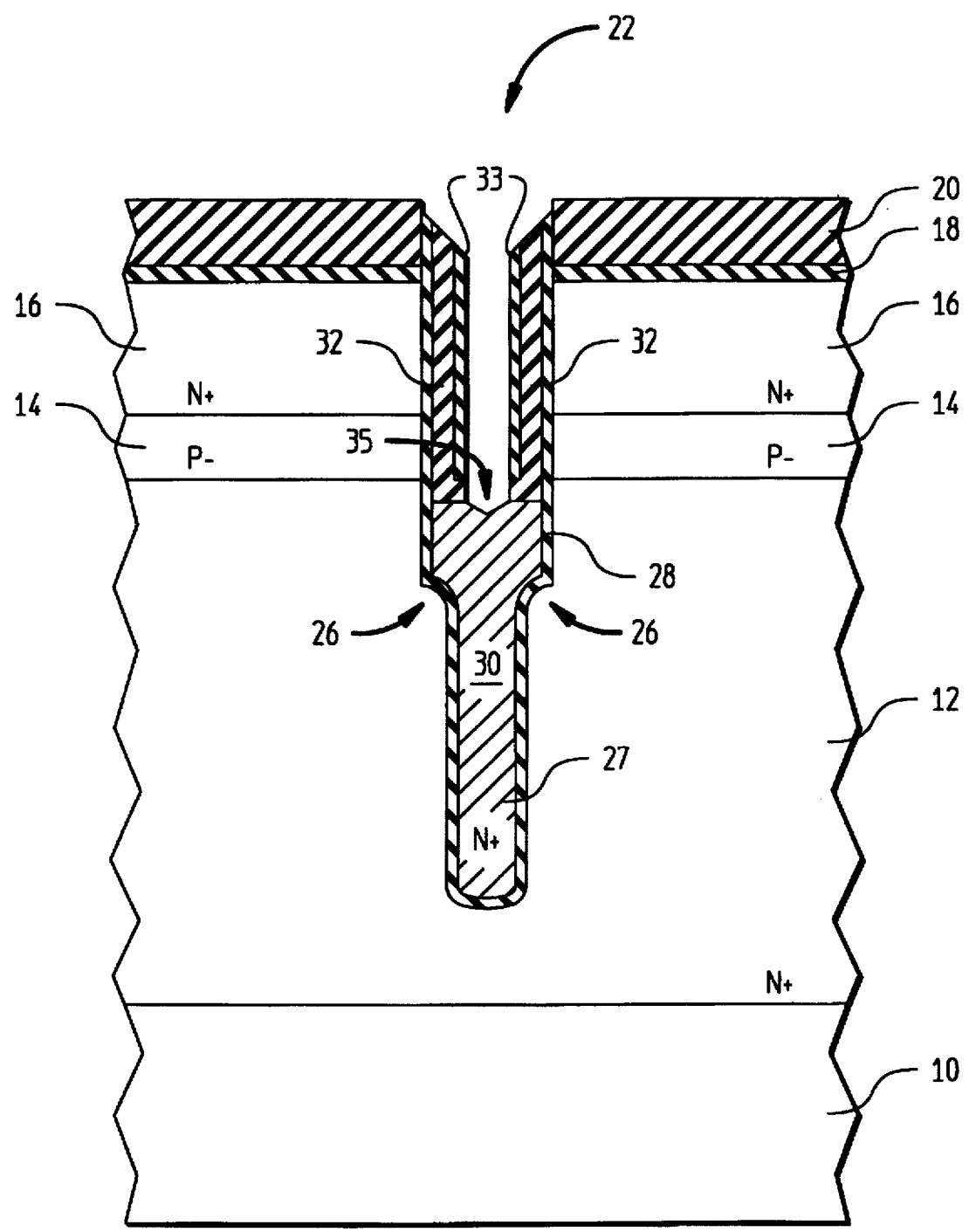

The bottom portions of oxide layer 32 and nitride layer 33 in the center of the trench are then etched away to expose the top portion of the polysilicon fill plug 30 as is shown in FIG. 5B. The portions of layers 32 and 33 overlaying the nitride layer 20 are also etched away at this time. A directional etch such as reactive ion etch (RIE) is preferably employed. During this process step, a small recess 35 is intentionally formed in the fill plug 30, which serves as a foundation for the polysilicon epitaxial growth to be described. Precautions must be taken in the etching step to prevent the nitride layer 33 on the sidewalls from being substantially consumed. Whether or not the nitride layer 33 is utilized, this etching of the bottom portion of the isolation collar often consumes some of the isolation collar sidewalls, resulting in a tapered trench. In the prior art CVD processes, the integrity of the polysilicon fill within the upper portion of the trench is highly dependent upon the trench shape and thus, the etching process has to be closely controlled to keep the shape within a narrow tolerance window. The selective epitaxial growth of the trench polysilicon to be described is relatively independent of trench shape. This allows for a broader process window for the preceding isolation collar etching step.

Figure 6:
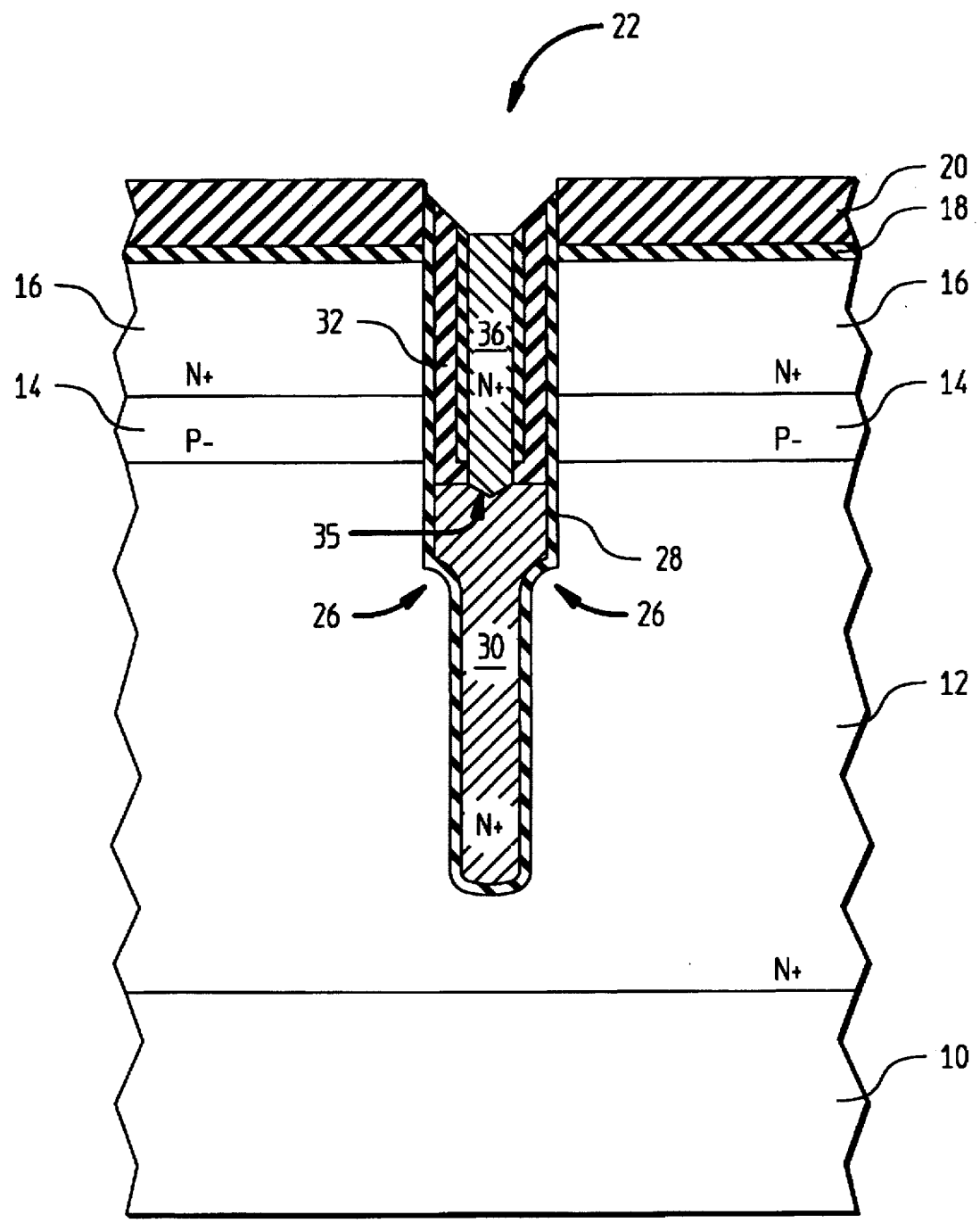
FIG. 6 shows a second polysilicon fill plug epitaxially grown within the trench of FIG. 5B.

Following the etching of the bottom portions of layers 32 and 33, a second polysilicon fill plug 36, shown in FIG. 6, is grown on the first fill plug 30 by means of selective epitaxial growth. This epitaxial growth of the second fill 36 is a key aspect of the present invention. The selective epitaxial growth occurs from the bottom up, i.e., from the recess of the first fill 30 to the top portion of the oxide layer 32, resulting in a void free polysilicon fill. The polysilicon fill 36 is doped to a N+ impurity level either by using in-situ doped selective epitaxy or by using intrinsic selective epitaxy followed by an ion implantation step. The doping agent is preferably arsenic to achieve this N+ doping concentration. In the case where the first polysilicon fill 30 is doped P+, the second fill 36 will of course also be doped P+.

The selective epitaxial growth process for forming the second fill plug 36 replaces prior art processes which utilized LPCVD. A variety of problems with the LPCVD process are obviated with the selective epitaxial growth. These include the problems of voids and seams resulting from the LPCVD which lead to conductive stringers and residues formed during subsequent gate electrode patterning.

The polysilicon is epitaxially grown in the trench to form the fill plug 36 by using a gas-solid or heterogeneous reaction system. The heterogeneous reaction system preferably employs a combination of gases including $H_2$, $SiCl_4$, HCl and a dopant gas containing arsenic to provide a N+ doping level. (When a P+ doping concentration is desired, a dopant gas containing boron is used). In an alternate technique, the dopant gas may be excluded and the fill plug 36 doped to the desired impurity level using selective ion implantation with appropriate masking after the epitaxial growth is complete. In this latter case, the ion implantation can be tailored to dope the first polysilicon fill plug 30 at the same time, provided that the fill plug 30 was not already doped, of course.

In order to provide a rapid filling of the trench 22, the epitaxial growth process is performed at a temperature within the range of about 900°–1100° C. Since the portion of the trench 22 to be filled via epitaxial growth is deep—typically between 1.0–2.0 microns—this rapid filling of the trench is highly desirable. The epitaxial growth occurs vertically to a level protruding above the top surface of silicon layer 16, as shown. Also, the device is subjected to the high ambient temperature for at least several minutes prior to the epitaxial growth in a pre-bake step. This pre-bake enhances the integrity of the interface between the fill 30 and the fill 36 at the recess 35. A low contact resistance is thus provided at that interface.

Figure 7:
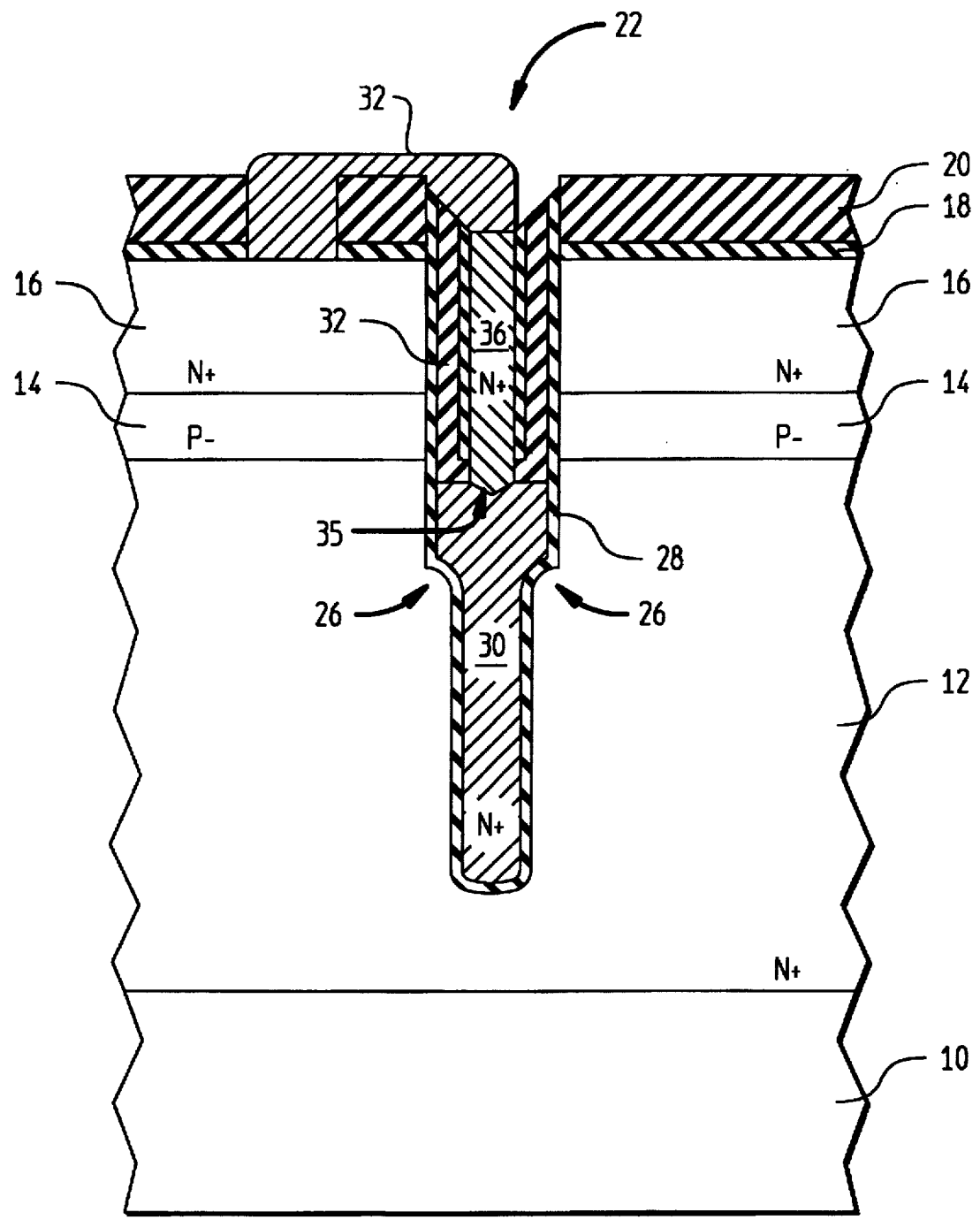
FIG. 7 depicts an electrode formed between the trench cell capacitor of FIG. 6 and a well region of the memory cell transistor.

In subsequent steps, the hard mask layers 20 and 18 are selectively etched to expose a portion of the well region 16. As shown in FIG. 7, a gate electrode 37 is then formed using suitable metallization to interconnect the top surface of the polysilicon fill plug and the exposed surface of the well region 16. Such gate electrode formation is well known in the art. The gate electrode 37 functions to transfer the logic level voltages to and from the word line and the trench capacitor.

Thus disclosed is an improved process for fabricating a trench cell capacitor which utilizes selective epitaxial growth to form the top polysilicon fill layer within the trench. The process according to the invention results in an improved trench cell capacitor with less voids and seams in the trench polysilicon as compared to trench capacitors fabricated using the CVD processes of the prior art. Residue and stringer formation problems during subsequent gate electrode patterning are eliminated with the present invention. In addition, the softer and void free surfaces of the epitaxially grown trench polysilicon enhances the robustness of the memory cell, allowing a broader process window for subsequent oxidations. The process of the present invention is also simpler than the prior art inasmuch as it eliminates the need for trench polysilicon and isolation collar annealing, chemical mechanical polishing (CMP), cleans, and trench fill recess steps. Moreover, the risk of thinning the oxide/nitride hard mask during CMP is eliminated. Finally, a broader process window for the trench etching is provided because the epitaxially grown trench polysilicon is highly robust independent of the trench shape.

It will be understood that the embodiments described herein are merely exemplary and that a person skilled in the art may make many variations and modifications without departing from the spirit and scope of the invention. All such variations and modifications are intended to be included within the scope of the invention as defined by the appended claims.

What is claimed is:

1. In a process for fabricating a trench cell capacitor having a trench penetrating a doped buried layer within a semiconductor body, said doped buried layer forming a first plate of said capacitor, said trench having a lower portion filled with doped semiconductor material to partially form a second plate of said capacitor, and a peripheral dielectric layer separating said first capacitor plate and said second partially formed capacitor plate, the improvement therewith comprising the steps of:

forming an isolation collar in a top portion of said trench, said isolation collar comprising a layer of nitride deposited on a layer of oxide; and filling said top portion of said trench in a region surrounded by said isolation collar by epitaxially growing semiconductor material to complete said second plate of said capacitor.

2. The process according to claim 1 wherein said epitaxially growing is performed in the presence of arsenic such that said epitaxially grown semiconductor material has a N+ doping concentration.

3. The process according to claim 1 wherein said epitaxially growing is performed in the absence of a doping agent, and further comprising the step of doping said epitaxially grown semiconductor material by ion implantation.

4. The process according to claim 1 wherein said semiconducting material in said top portion of said trench is epitaxially grown on a doped polysilicon plug disposed within said lower portion of said trench.

5. The process according to claim 4 wherein said epitaxially growing is performed in a heterogenous reaction system employing $h_2$, $SiCl_4$, HCl and a dopant gas.

6. The process according to claim 1 wherein said trench extends to a depth of about five microns within said semiconductor body, said trench having a width in the range of 0.25–0.5 microns.

7. The process according to claim 5 wherein said epitaxially grown semiconductor material is grown to a length in the range of 1.0 to 2.0 microns.

8. A process for fabricating a trench cell capacitor within a silicon substrate, comprising the steps of:

forming a doped buried layer within said silicon substrate to provide a first plate of said capacitor;

forming a trench within said silicon substrate to a depth level penetrating the buried layer;

depositing a dielectric layer peripherally within said trench;

filling a lower portion of said trench with doped polysilicon to partially form a second plate of said capacitor, wherein said first plate and second partially formed plate are separated by said dielectric layer;

forming an isolation collar peripherally within an upper portion of said trench, said isolation collar comprising a layer of nitride deposited on a layer of oxide; and epitaxially growing polysilicon within said isolation collar, said epitaxially grown polysilicon completing said second plate of said capacitor.

9. The process according to claim 8 wherein said filling of said lower portion of said trench is performed using directional low pressure chemical vapor deposition (DLPCVD).

10. The process according to claim 8 wherein said step of epitaxially growing is performed in a heterogenous reaction system employing $H_2$, $SiCl_4$, HCl and a gaseous arsenic compound to provide a N+ impurity concentration.

11. The process according to claim 8 wherein said dielectric layer is deposited to a thickness in the range of 10–50 nm, and said isolation collar is formed to a thickness in the range of 65–170 nm.

12. The process according to claim 8 wherein said isolation collar is formed by the steps of:

depositing a layer of silicon dioxide on a top surface of said doped polysilicon and peripherally along sidewalls of said upper portion of said trench;

depositing a silicon nitride layer on exposed portions of said silicon dioxide layer within said trench;

etching away a bottom portion of said silicon nitride layer and a bottom portion of said silicon dioxide layer to expose said top surface of said doped polysilicon.

13. The process according to claim 12 wherein said trench is formed with a width in the range of 0.25–0.5 microns, said silicon dioxide layer is deposited to a thickness in the range of 50–100 nm; and said silicon nitride layer is deposited to a thickness in the range of 5–20 nm.

14. The process according to claim 8 wherein said lower portion of said trench is initially filled with intrinsic polysilicon, said epitaxially growing is performed in the absence of a doping agent, and further comprising the step of doping said polysilicon within said lower portion of said trench and said epitaxially grown polysilicon in said upper portion of said trench by ion implantation.

* * * * *

UNITED STATES PATENT AND TRADEMARK OFFICE
CERTIFICATE OF CORRECTION

PATENT NO. : 5,677,219
DATED : Oct. 14, 1997
INVENTOR(S) : Mazuré et al.

It is certified that error appears in the above-indentified patent and that said Letters Patent is hereby corrected as shown below:

Title page, Item [19],

<u>Delete</u> "Mazuréet al." and <u>insert</u> in its place --Mazuré et al.--

Signed and Sealed this

Thirtieth Day of December, 1997

*Attest:*

BRUCE LEHMAN

*Attesting Officer*       Commissioner of Patents and Trademarks